US012604482B2

(12) United States Patent
Shinohara et al.

(10) Patent No.: US 12,604,482 B2
(45) Date of Patent: Apr. 14, 2026

(54) MAGNETIC DOMAIN WALL MOVING ELEMENT AND MAGNETIC RECORDING ARRAY

(71) Applicant: TDK CORPORATION, Tokyo (JP)

(72) Inventors: Tetsuhito Shinohara, Tokyo (JP); Takuya Ashida, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 642 days.

(21) Appl. No.: 17/610,339

(22) PCT Filed: May 12, 2020

(86) PCT No.: PCT/JP2020/018894
§ 371 (c)(1),
(2) Date: Nov. 10, 2021

(87) PCT Pub. No.: WO2020/230771
PCT Pub. Date: Nov. 19, 2020

(65) Prior Publication Data
US 2022/0231084 A1      Jul. 21, 2022

(30) Foreign Application Priority Data

May 16, 2019      (JP) ................................. 2019-092867

(51) Int. Cl.
*G11C 11/16*          (2006.01)
*H10B 61/00*          (2023.01)
(Continued)

(52) U.S. Cl.
CPC ............ *H10B 61/22* (2023.02); *G11C 11/161* (2013.01); *H10N 50/80* (2023.02); *H10N 50/85* (2023.02)

(58) Field of Classification Search
CPC ........ H10N 50/80; H10N 50/85; H10N 52/85; H10N 50/10; H10N 50/20; G11C 11/161;
(Continued)

(56) References Cited

U.S. PATENT DOCUMENTS

2004/0262627 A1*  12/2004  Doerner ................. B82Y 10/00
                                                                        257/104
2010/0055503 A1*   3/2010  Shimatsu ............... H10N 50/85
                                                                        204/192.15
(Continued)

FOREIGN PATENT DOCUMENTS

JP          2012-039009 A      2/2012
JP          2013-069906 A      4/2013
(Continued)

OTHER PUBLICATIONS

Jul. 21, 2020 Search Report issued in International Patent Application No. PCT/JP2020/018894.

*Primary Examiner* — Matthew C Landau
*Assistant Examiner* — David W Ward
(74) *Attorney, Agent, or Firm* — Oliff PLC

(57) ABSTRACT

A magnetic domain wall moving element includes a magnetic recording layer which extends in a first direction and includes a ferromagnetic material, and a first conductive layer and a second conductive layer which are separately connected to the magnetic recording layer, the first conductive layer includes a ferromagnetic first layer in contact with the magnetic recording layer, the first layer includes a mixing layer at an interface with the magnetic recording layer, a ferromagnetic material and a dissimilar metal are mixed in the mixing layer, and the dissimilar metal is a metal different from each of the ferromagnetic material that mainly constitutes the first layer and the ferromagnetic material that mainly constitutes the magnetic recording layer.

13 Claims, 10 Drawing Sheets

100

(51) Int. Cl.
    *H10N 50/80*         (2023.01)
    *H10N 50/85*         (2023.01)

(58) Field of Classification Search
    CPC .. H01F 10/3272; H01F 10/329; H01F 10/328;
                         H10B 61/00–22
    See application file for complete search history.

(56)            References Cited

U.S. PATENT DOCUMENTS

| | | |
|---|---|---|
| 2010/0188890 A1 | 7/2010 | Fukami et al. |
| 2011/0199818 A1 | 8/2011 | Fukami et al. |
| 2013/0064009 A1* | 3/2013 | Kitano ................. G11C 11/161 |
| | | 365/158 |
| 2013/0075846 A1* | 3/2013 | Suemitsu ........... G11C 11/1659 |
| | | 257/E29.323 |
| 2014/0084399 A1* | 3/2014 | Doczy .................... H10N 50/10 |
| | | 257/E29.323 |
| 2016/0064654 A1* | 3/2016 | Tonegawa ............. H10B 61/22 |
| | | 257/421 |
| 2018/0198059 A1* | 7/2018 | Ko .................... H01L 21/76804 |
| 2019/0131519 A1* | 5/2019 | Ikegawa ............... H10N 50/01 |
| 2019/0304526 A1* | 10/2019 | Honjo ................. G11C 11/1657 |
| 2019/0312198 A1* | 10/2019 | Sun ........................ H10N 50/10 |
| 2019/0393265 A1* | 12/2019 | Ying ..................... H10B 61/22 |
| 2021/0104659 A1* | 4/2021 | Fukuzawa ............. H10B 61/00 |

FOREIGN PATENT DOCUMENTS

| | | |
|---|---|---|
| JP | 5397384 B2 | 1/2014 |
| JP | 2017-220511 A | 12/2017 |
| WO | 2009/001706 A1 | 12/2008 |

* cited by examiner

412

A1

A2

413

MAGNETIC DOMAIN WALL MOVING ELEMENT AND MAGNETIC RECORDING ARRAY

TECHNICAL FIELD

The present invention relates to a magnetic domain wall moving element and a magnetic recording array. Priority is claimed on Japanese Patent Application No. 2019-092867, filed May 16, 2019, the content of which is incorporated herein by reference.

BACKGROUND ART

Attention is being focused on next-generation non-volatile memories that will replace flash memories and the like whose microfabrication has reached its limit. For example, a magnetoresistive random access memory (MRAM), a resistance random access memory (ReRAM), a phase change random access memory (PCRAM), and the like are known as next-generation non-volatile memories.

MRAM uses a change in resistance value caused by a change in a magnetization direction for data recording. In order to realize a larger capacitance of a recording memory, reduction in size of elements constituting the memory and multi-valued recording bits per element constituting the memory are being studied.

Patent Literature 1 describes a magnetic domain wall moving element in which multi-valued data can be recorded by moving a domain wall in a data recording layer. Patent Literature 1 describes that magnetization of a magnetization pinned region is formed by utilizing a difference in coercive force.

CITATION LIST

Patent Literature

[Patent Literature 1]
Japanese Patent No. 5397384

SUMMARY OF INVENTION

Technical Problem

A magnetic recording layer in which a domain wall moves often has magnetization pinned regions at both ends in order to prevent the domain wall from reaching any one end and disappearing. When a domain wall intrudes into a magnetization pinned region, the domain wall may disappear. Since a magnetic domain wall moving element records data at a position of a domain wall, data cannot be recorded when the domain wall disappears.

The present invention has been made in view of the above problems, and provides a magnetic domain wall moving element and a magnetic recording array in which movement of a domain wall can easily be controlled.

Solution to Problem (1) A magnetic domain wall moving element according to a first aspect includes a magnetic recording layer which extends in a first direction and includes a ferromagnetic material, and a first conductive layer and a second conductive layer which are separately connected to the magnetic recording layer, in which the first conductive layer includes a first layer that exhibits ferromagnetism and in contact with the magnetic recording layer, the first layer includes a mixing layer at an interface with the magnetic recording layer, a ferromagnetic material and a dissimilar metal are mixed in the mixing layer, and the dissimilar metal is a metal different from each of the ferromagnetic material that mainly constitutes the first layer and the ferromagnetic material that mainly constitutes the magnetic recording layer.

(2) In the magnetic domain wall moving element according to the above aspect, the first conductive layer may have a second layer that exhibits non-magnetic ferromagnetism and a third layer that exhibits ferromagnetism in order on a surface of the first layer opposite to the magnetic recording layer.

(3) In the magnetic domain wall moving element according to the above aspect, the dissimilar metal may be a non-magnetic metal.

(4) In the magnetic domain wall moving element according to the above aspect, a concentration of the dissimilar metal may be higher on a first surface of the mixing layer on a side closer to the magnetic recording layer than on a second surface opposite to the first surface.

(5) In the magnetic domain wall moving element according to the above aspect, the dissimilar metal has a concentration distribution in the first direction, and a first end of the mixing layer on a side closer to a center of the magnetic recording layer in the first direction has a higher concentration of the dissimilar metal than the second end opposite to the first end.

(6) In the magnetic domain wall moving element according to the above aspect, the dissimilar metal may be locally distributed in the mixing layer.

(7) In the magnetic domain wall moving element according to the above aspect, the mixing layer may include a first portion in which the dissimilar metal is locally distributed, and a thickness of the mixing layer may vary from place to place due to the first portion.

(8) In the magnetic domain wall moving element according to the above aspect, a surface of the mixing layer may be uneven in a laminating direction due to the first portion in which the dissimilar metal is locally distributed.

(9) In the magnetic domain wall moving element according to the above aspect, the magnetic recording layer may include a second mixing layer on a side opposite to a surface connected to the first conductive layer, the ferromagnetic material and the dissimilar metal included in the magnetic recording layer may be mixed in the second mixing layer, and the dissimilar metal may be a metal different from the ferromagnetic material that mainly constitutes the magnetic recording layer.

(10) In the magnetic domain wall moving element according to the above aspect, the second conductive layer may include a fourth layer that exhibits ferromagnetic in contact with the magnetic recording layer, the fourth layer may include a third mixing layer at an interface with the magnetic recording layer, a ferromagnetic material and a dissimilar metal may be mixed in the third mixing layer, and the dissimilar metal may be a metal different from each of the ferromagnetic material that mainly constitutes the fourth layer and the ferromagnetic material that mainly constitutes the magnetic recording layer.

(11) A magnetic domain wall moving element according to a second aspect includes a magnetic recording layer which extends in a first direction and includes a ferromagnetic material, and a first conductive layer and a second conductive layer which are separately connected to the magnetic recording layer, in which the first conductive layer includes a first layer that exhibits ferromagnetism and in contact with the magnetic recording layer, the first layer includes a mixing layer at an interface with the magnetic recording layer, a non-magnetic material and a ferromagnetic material are alternately laminated in the first layer, and the ferromagnetic material and the non-magnetic material are mixed in the mixing layer.

(12) The magnetic domain wall moving element according to the above aspect may further include a first ferromagnetic layer facing the magnetic recording layer, and a non-magnetic layer located between the first ferromagnetic layer and the magnetic recording layer.

(13) A magnetic recording array according to a third aspect includes a plurality of magnetic domain wall moving elements according to the above aspects.

Advantageous Effects of Invention

The magnetic domain wall moving element and the magnetic recording array according to the above aspects can easily control movement of a domain wall.

DESCRIPTION OF EMBODIMENTS

Figure 1:
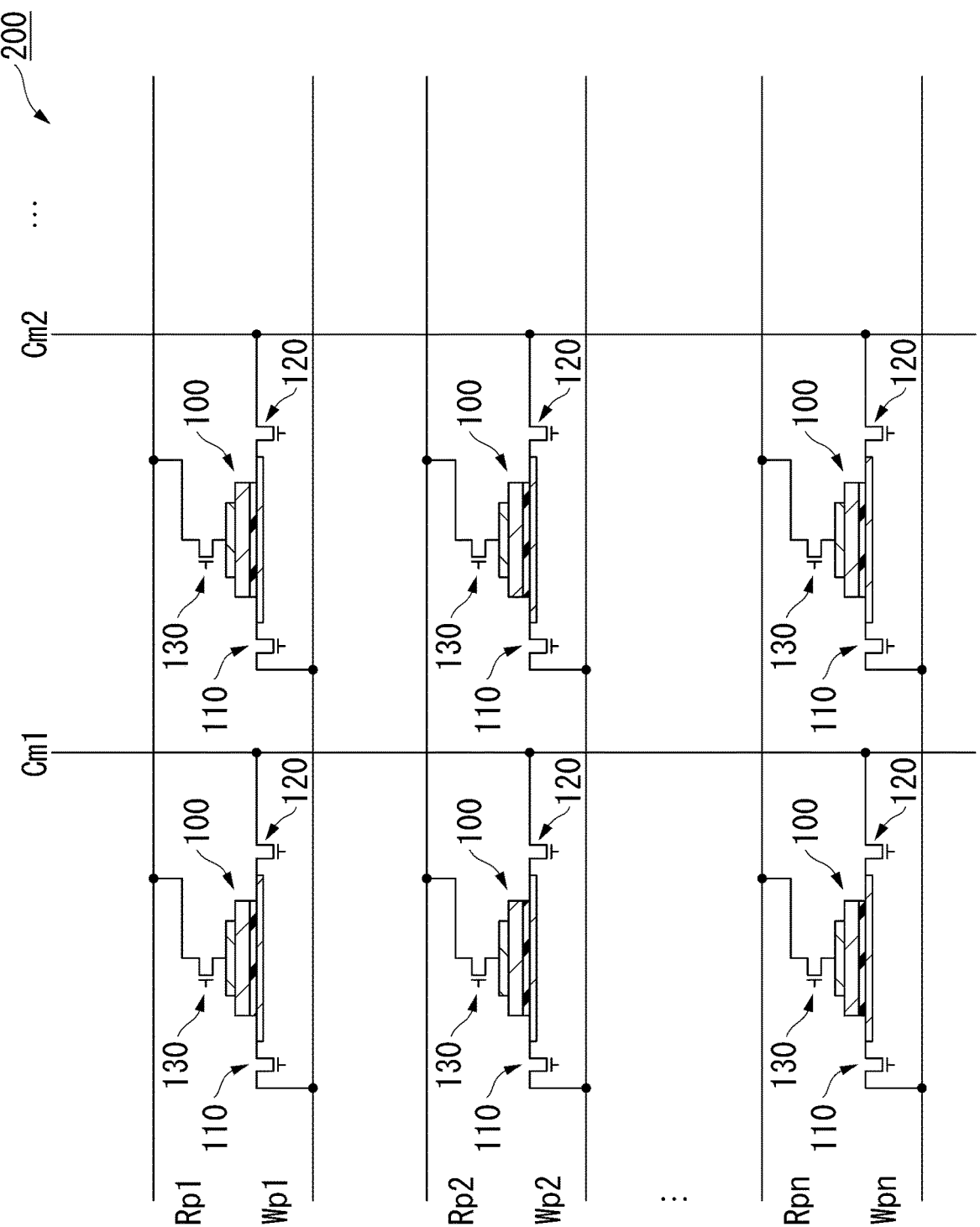
FIG. 1 is a configuration diagram of a magnetic recording array according to a first embodiment.

Hereinafter, the present embodiment will be described in detail with reference to the drawings as appropriate. In the drawings used in the following description, featured portions may be shown enlarged for convenience in order to make features of the present invention easy to understand, and dimensional ratios and the like of respective constituent elements may differ from actual ones. Materials, dimensions, and the like exemplified in the following description are examples, and the present invention is not limited thereto and can be appropriately modified and carried out within the range in which the effects of the present invention can be achieved.

First, directions will be defined. A +x direction, a −x direction, a +y direction, and a −y direction are directions substantially parallel to one surface of a substrate Sub (see FIG. 2), which will be described later. The +x direction is a direction in which a magnetic recording layer 20 extends, which will be described later, and is a direction from a first conductive layer 40 toward a second conductive layer 50, which will be described later. The −x direction is a direction opposite to the +x direction. In a case in which the +x direction and the −x direction are not distinguished, they are simply referred to as an "x direction." The x direction is an example of a first direction. The +y direction is one direction orthogonal to the x direction. The −y direction is a direction opposite to the +y direction. In a case in which the +y direction and the −y direction are not distinguished, they are simply referred to as a "y direction." A +z direction is a direction from the substrate Sub, which will be described later, toward a magnetic domain wall moving element 100. A −z direction is a direction opposite to the +z direction. In a case in which the +z direction and the −z direction are not distinguished, they are simply referred to as a "z direction." The z direction is an example of a laminating direction. Further, in the present specification, "extending in the x direction" means that, for example, a dimension in the x direction is larger than the smallest dimension among dimensions in the x direction, the y direction, and the z direction. The same applies to cases of extending in other directions.

First Embodiment

FIG. 1 is a configuration diagram of a magnetic recording array according to a first embodiment. A magnetic recording array 200 includes a plurality of magnetic domain wall moving elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130. The magnetic recording array 200 can be used, for example, for a magnetic memory, a product-sum calculator, and a neuromorphic device.

<First Wirings, Second Wirings, and Third Wirings>

The first wirings Wp1 to Wpn are write wirings, respectively. The write wirings are used when data is written. Each of the first wirings Wp1 to Wpn electrically connects a power supply to one or more magnetic domain wall moving elements 100. The power supply is connected to one end of the magnetic recording array 200 during use.

The second wirings Cm1 to Cmn are common wirings, respectively. The common wirings are used both when data is written and when data is read. Each of the second wirings Cm1 to Cmn electrically connects a reference potential to one or more magnetic domain wall moving elements 100. The reference potential is, for example, a ground. The second wirings Cm1 to Cmn may be provided for each of the plurality of magnetic domain wall moving elements 100 or may be provided over the plurality of magnetic domain wall moving elements 100, respectively.

The third wirings Rp1 to Rpn are read wirings, respectively. The read wirings are used when data is read. Each of the third wirings Rp1 to Rpn electrically connects the power supply to one or more magnetic domain wall moving elements 100. The power supply is connected to one end of the magnetic recording array 200 during use.

<First Switching Elements, Second Switching Elements, and Third Switching Elements>

The first switching element 110, the second switching element 120, and the third switching element 130 shown in FIG. 1 are connected to each of the plurality of magnetic domain wall moving elements 100. A device in which switching elements are connected to the magnetic domain wall moving element 100 is referred to as a semiconductor device. The first switching element 110 is connected between the magnetic domain wall moving element 100 and the first wiring Wp1 to Wpn. The second switching element 120 is connected between the magnetic domain wall moving element 100 and the second wiring Cm1 to Cmn. The third switching element 130 is connected between the magnetic domain wall moving element 100 and the third wiring Rp1 to Rpn.

When the first switching element 110 and the second switching element 120 are turned on, write currents flow between one of the first wirings Wp1 to Wpn and one of the second wirings Cm1 to Cmn connected to predetermined magnetic domain wall moving element 100. When the first switching element 110 and the third switching element 130 are turned on, read currents flow between one of the second wirings Cm1 to Cmn and one of the third wirings Rp1 to Rpn connected to predetermined magnetic domain wall moving element 100.

The first switching elements 110, the second switching elements 120, and the third switching elements 130 are elements that control a flow of an electric current. The first switching elements 110, the second switching elements 120, and the third switching elements 130 are, for example, elements that utilize a phase change of a crystal layer, such as transistors and Ovonic threshold switches (OTSs), elements that utilize a change in band structure, such as metal-insulator transition (MIT) switches, elements that utilize a breakdown voltage, such as Zener diodes and avalanche diodes, and elements whose conductivity changes with a change in atomic position.

Any one of the first switching elements 110, the second switching elements 120, and the third switching elements 130 may be shared by the magnetic domain wall moving elements 100 connected to the same wirings. For example, in a case in which the first switching elements 110 are shared, one of the first switching elements 110 is disposed upstream from the first wirings Wp1 to Wpn. For example, in a case in which the second switching elements 120 are shared, one of the second switching elements 120 is disposed upstream from the second wirings Cm1 to Cmn. For example, in a case in which the third switching elements 130 are shared, one of the third switching elements 130 is disposed upstream from the third wirings Rp1 to Rpn.

Figure 2:
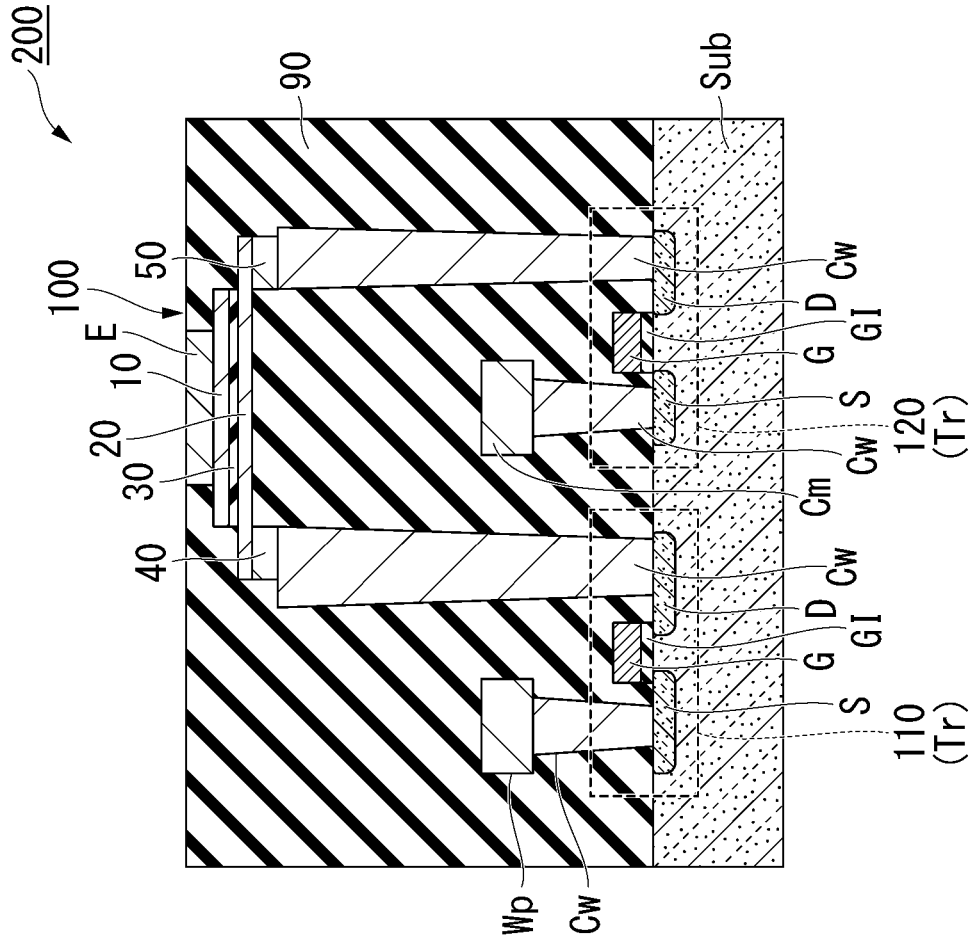
FIG. 2 is a cross-sectional view of a featured portion of the magnetic recording array according to the first embodiment.
Figure 2:
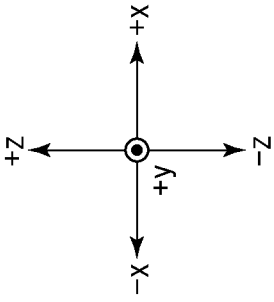

FIG. 2 is a cross-sectional view of a featured portion of the magnetic recording array 200 according to the first embodiment. FIG. 2 shows a cross-section of one magnetic domain wall moving element 100 in FIG. 1 cut along an xz plane passing through a center of a width of the magnetic recording layer 20 in the y direction.

The first switching element 110 and the second switching element 120 shown in FIG. 2 are transistors Tr. The transistors Tr each have a gate electrode G, a gate insulating film GI, and a source region S and a drain region D that are formed on the substrate Sub. The substrate Sub is, for example, a semiconductor substrate. The third switching element 130 is electrically connected to an electrode E and is located, for example, in a depth direction (−y direction) of the paper surface.

Each of the transistors Tr and the magnetic domain wall moving element 100 are electrically connected to each other via connection wirings Cw. The connection wirings Cw include a conductive material. The connection wirings Cw extend in the z direction. The connection wirings Cw are, for example, via wirings formed in opening portions of an insulating layer 90.

The magnetic domain wall moving element 100 and the transistors Tr are electrically separated by the insulating layer 90 except for the connection wirings Cw. The insulating layer 90 is an insulating layer that insulates between wirings of multilayer wirings and between elements. The insulating layer 90 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

"Magnetic Domain Wall Moving Element"

Figure 3:
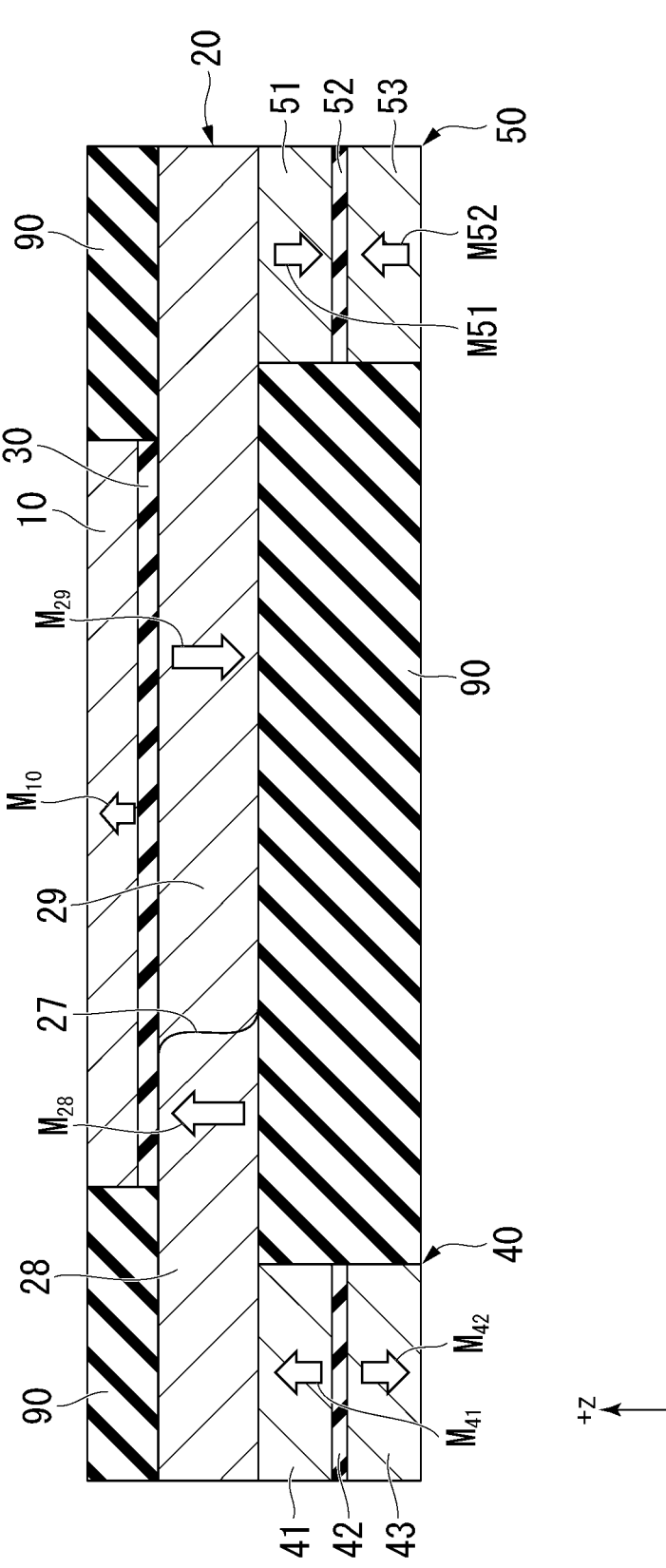
FIG. 3 is a cross-sectional view of a magnetic domain wall moving element according to the first embodiment.

FIG. 3 is a cross-sectional view of the magnetic domain wall moving element 100 according to the first embodiment. The magnetic domain wall moving element 100 has a first ferromagnetic layer 10, a magnetic recording layer 20, a non-magnetic layer 30, a first conductive layer 40, and a second conductive layer 50. FIG. 3 is a cross-sectional view of the magnetic domain wall moving element 100 cut along the xz plane passing through the center of the magnetic recording layer 20 in the y direction. FIG. 3 is an enlarged view of a portion of FIG. 2, and a periphery of the magnetic domain wall moving element 100 is covered with the insulating layer 90. The magnetic domain wall moving element 100 is used as a storage element as an example.

"First Ferromagnetic Layer"

The first ferromagnetic layer 10 faces the non-magnetic layer 30. The first ferromagnetic layer 10 is, for example, in contact with the non-magnetic layer 30. The first ferromagnetic layer 10 has a magnetization $M_{10}$ oriented in one direction. The direction in which the magnetization $M_{10}$ of the first ferromagnetic layer 10 is oriented is less likely to change than that of magnetization of the magnetic recording layer 20 when a predetermined external force is applied. The predetermined external force is, for example, an external force applied to the magnetization by an external magnetic field or an external force applied to the magnetization by a spin polarization current. The first ferromagnetic layer 10 is sometimes called a magnetization pinned layer or a magnetization reference layer. The magnetization $M_{10}$ is oriented in the z direction, for example.

Hereinafter, an example in which the magnetization is oriented in the z direction will be described, but the magnetizations of the magnetic recording layer 20 and the first ferromagnetic layer 10 may be oriented in the x direction, or may be oriented in any direction in an xy plane. In a case in which the magnetizations are oriented in the z direction, power consumption and heat generation during operation of the magnetic domain wall moving element 100 are inhibited as compared with the case in which the magnetizations are oriented in the xy plane. Also, in the case in which the magnetizations are oriented in the z direction, a movement width of a domain wall 27 deceases when a pulse current of the same intensity is applied as compared with the case in which the magnetizations are oriented in the xy plane. On the other hand, in the case in which the magnetizations are oriented in any direction in the xy plane, a magnetic resistance change width (MR ratio) of the magnetic domain wall moving element 100 increases as compared with the case in which the magnetizations are oriented in the z direction.

The first ferromagnetic layer 10 includes a ferromagnetic material. The ferromagnetic material constituting the first ferromagnetic layer 10 is, for example, a metal selected from the group consisting of Cr, Mn, Co, Fe and Ni, an alloy including one or more species of these metals, an alloy including these metals and at least one or more species of elements of B, C, and N, or the like. The first ferromagnetic layer 10 is, for example, Co—Fe, Co—Fe—B, or Ni—Fe.

The material constituting the first ferromagnetic layer 10 may be a Heusler alloy. A Heusler alloy is a half metal and has high spin polarizability. A Heusler alloy is an intermetallic compound having a chemical composition of XYZ or $X_2YZ$, in which X is a transition metal element or a noble metal element of the Co, Fe, Ni, or Cu group on the periodic table, Y is a transition metal of the Mn, V, Cr or Ti group or an elemental species of X, and Z is a typical element of groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

In a case in which a magnetization easy axis of the first ferromagnetic layer 10 is in the z direction (it is formed as a perpendicular magnetization film), a film thickness of the first ferromagnetic layer 10 is preferably 1.5 nm or less, more preferably 1.0 nm or less. When the thickness of the first ferromagnetic layer 10 decreases, vertical magnetic anisotropy (interfacial perpendicular magnetic anisotropy) is added to the first ferromagnetic layer 10 at an interface between the first ferromagnetic layer 10 and another layer (the non-magnetic layer 30), and the magnetization of the first ferromagnetic layer 10 is easily oriented in the z direction.

In the case in which the magnetization easy axis of the first ferromagnetic layer 10 is in the z direction (it is formed as the perpendicular magnetization film), it is preferable that the first ferromagnetic layer 10 be a laminate of a ferromagnetic material selected from the group consisting of Co, Fe and Ni and a non-magnetic material selected from the group consisting of Pt, Pd, Ru and Rh, and it is more preferable to insert an intermediate layer selected from the group consisting of Ir and Ru into any position of the laminate. Vertical magnetic anisotropy can be made stronger by laminating the ferromagnetic material and the non-magnetic material, and the magnetization of the first ferromagnetic layer 10 can be easily oriented in the z direction by inserting the intermediate layer.

An antiferromagnetic layer may be provided on a surface of the first ferromagnetic layer 10 opposite to the non-magnetic layer 30 via a spacer layer. The first ferromagnetic layer 10, the spacer layer, and the antiferromagnetic layer have a synthetic antiferromagnetic structure (SAF structure). The synthetic antiferromagnetic structure consists of two magnetic layers sandwiching a non-magnetic layer. The first ferromagnetic layer 10 and the antiferromagnetic layer are antiferromagnetically coupled, and thus a coercive force of the first ferromagnetic layer 10 increases as compared with the case in which the anti ferromagnetic layer is not provided. The antiferromagnetic layer is, for example, IrMn, PtMn, or the like. The spacer layer includes, for example, at least one selected from the group consisting of Ru, Ir, and Rh.

"Magnetic Recording Layer"

The magnetic recording layer 20 extends in the x direction. The magnetic recording layer 20 is, for example, a rectangle having a major axis in the x direction and a minor axis in the y direction in a plan view seen in the z direction.

The magnetic recording layer 20 is a magnetic layer facing the first ferromagnetic layer 10 with the non-magnetic layer 30 interposed therebetween. The magnetic recording layer 20 extends over the first conductive layer 40 and the second conductive layer 50.

The magnetic recording layer 20 is a layer capable of magnetically recording information by changing an internal magnetic state thereof. The magnetic recording layer 20 has a first magnetic domain 28 and a second magnetic domain 29 therein. A magnetization $M_{28}$ of the first magnetic domain 28 and a magnetization $M_{29}$ of the second magnetic domain 29 are oriented in opposite directions, for example. A boundary between the first magnetic domain 28 and the second magnetic domain 29 is the domain wall 27. The magnetic recording layer 20 can have the domain wall 27 therein. In the magnetic recording layer 20 shown in FIG. 3, the magnetization $M_{28}$ of the first magnetic domain 28 is oriented in the +z direction, and the magnetization $M_{29}$ of the second magnetic domain 29 is oriented in the −z direction.

Magnetizations of a portion that overlaps the first conductive layer 40 and a portion that overlaps the second conductive layer 50 in the z direction of the magnetic recording layer 20 are fixed in one direction. The portion that overlaps the first conductive layer 40 and the portion that overlaps the second conductive layer 50 in the z direction of the magnetic recording layer 20 may be referred to as a magnetization pinned region. The portion that overlaps the first conductive layer 40 in the z direction of the magnetic recording layer 20 is fixed, for example, in the +z direction, and the portion that overlaps the second conductive layer 50 in the z direction of the magnetic recording layer 20 is fixed, for example, in the −z direction. Unless an excessive external force is applied, the domain wall 27 moves in a portion that does not overlap the first conductive layer 40 and the second conductive layer 50 in the z direction of the magnetic recording layer 20.

The magnetic domain wall moving element 100 can record data in multi-value or continuously depending on a position of the domain wall 27 of the magnetic recording layer 20. The data recorded on the magnetic recording layer 20 is read out as a resistance change value of the magnetic domain wall moving element 100 when a read-out current is applied.

Proportions of the first magnetic domain 28 and the second magnetic domain 29 in the magnetic recording layer 20 change as the domain wall 27 moves. The magnetization $M_{10}$ of the first ferromagnetic layer 10 is, for example, in the same direction as (parallel to) the magnetization $M_{28}$ of the first magnetic domain 28, and in the opposite direction (antiparallel) to the magnetization $M_{29}$ of the second magnetic domain 29. When the domain wall 27 moves in the +x direction and an area of the first magnetic domain 28 in the portion overlapping the first ferromagnetic layer 10 in a plan view seen in the z direction increases, a resistance value of the magnetic domain wall moving element 100 decreases. On the other hand, when the domain wall 27 moves in the −x direction and an area of the second magnetic domain 29 in the portion overlapping the first ferromagnetic layer 10 in a plan view seen in the z direction increases, the resistance value of the magnetic domain wall moving element 100 increases.

The domain wall 27 moves by passing a write current in the x direction of the magnetic recording layer 20 or applying an external magnetic field. For example, when a write current (for example, a current pulse) is applied in the +x direction of the magnetic recording layer 20, electrons flow in the −x direction opposite to the current, and thus the domain wall 27 moves in the −x direction. In a case in which a current flows from the first magnetic domain 28 to the second magnetic domain 29, spin-polarized electrons in the second magnetic domain 29 reverse the magnetization $M_{28}$ in the first magnetic domain 28. When the magnetization $M_{28}$ of the first magnetic domain 28 is reversed, the domain wall 27 moves in the −x direction.

The magnetic recording layer 20 is made of a magnetic material. The magnetic material constituting the magnetic recording layer 20 is, for example, a metal selected from the group consisting of Cr, Mn, Co, Fe and Ni, an alloy including one or more species of these metals, an alloy including these metals and at least one or more species of elements of B, C, and N, or the like. Specifically, the magnetic material constituting the magnetic recording layer 20 is, for example, Co—Fe, Co—Fe—B, or Ni—Fe.

The magnetic recording layer 20 may have at least one element selected from the group consisting of Co, Ni, Pt, Pd, Gd, Tb, Mn, Ge, and Ga. The magnetic recording layer 20 is, for example, a laminated film of Co and Ni, a laminated film of Co and Pt, or a laminated film of Co and Pd. Also, for example, the magnetic recording layer 20 may include a MnGa-based material, a GdCo-based material, or a TbCo-based material. Because ferromagnetic materials such as the MnGa-based material, the GdCo-based material, and the TbCo-based material have a small saturation magnetization, a threshold current required to move the domain wall decreases. Further, because the laminated film of Co and Ni, the laminated film of Co and Pt, and the laminated film of Co and Pd have a large coercive force, a moving speed of the domain wall decreases.

"Non-Magnetic Layer"

The non-magnetic layer 30 is located between the first ferromagnetic layer 10 and the magnetic recording layer 20. The non-magnetic layer 30 is laminated on one surface of the magnetic recording layer 20.

The non-magnetic layer 30 is made of, for example, a non-magnetic insulator, semiconductor or metal. The non-magnetic insulator is, for example, $Al_2O_3$, $SiO_2$, MgO, $MgAl_2O_4$, or a material in which Al, Si, and Mg in some of these are replaced with Zn, Be, and the like. These materials have a large bandgap and excellent insulating properties. In a case in which the non-magnetic layer 30 is made of a non-magnetic insulator, the non-magnetic layer 30 is a tunnel barrier layer. The non-magnetic metal is, for example, Cu, Au, Ag, or the like. The non-magnetic semiconductor is, for example, Si, Ge, $CuInSe_2$, $CuGaSe_2$, $Cu(In,Ga)Se_2$, or the like.

A thickness of the non-magnetic layer 30 is preferably 20 Å or more, and more preferably 30 Å or more. When the thickness of the non-magnetic layer 30 is large, a resistance area product (RA) of the magnetic domain wall moving element 100 increases. The resistance area product (RA) of the magnetic domain wall moving element 100 is preferably $1 \times 10^5$ $\Omega\mu m^2$ or more, and more preferably $1 \times 10^6$ $\Omega\mu m^2$ or more. The resistance area product (RA) of the magnetic domain wall moving element 100 is represented by a product of an elemental resistance of one magnetic domain wall moving element 100 and an elemental cross-sectional area (an area of a cut surface obtained by cutting the non-magnetic layer 30 on the xy plane) of the magnetic domain wall moving element 100.

"First Conductive Layer"

The first conductive layer 40 has a first layer 41, a second layer 42, and a third layer 43. The first layer 41 and the third layer 43 are ferromagnetic layers. The second layer 42 is a non-magnetic layer. The first layer 41 and the third layer 43 are antiferromagnetically coupled with the second layer 42 interposed therebetween. The first conductive layer 40 has an SAF structure. Magnetization $M_{41}$ of the first layer 41 is oriented in the +z direction, for example, and magnetization $M_{43}$ of the third layer 43 is oriented in the −z direction, for example. The second layer 42 may be referred to as an intermediate layer, an insertion layer, a magnetic coupling layer, or the like.

The same material as the first ferromagnetic layer 10 can be used for the first layer 41 and the third layer 43. The first layer 41 and the third layer 43 are made of, for example, a laminated film of Co and Ni, a laminated film of Co and Pd, a laminated film of Co and Pt, a CoCrPt alloy, a GdFe alloy, a TbCo alloy, or the like. The second layer 42 includes, for example, at least one selected from the group consisting of Ru, Ir, and Rh. A thickness of the second layer 42 is, for example, 0.1 nm to 10 nm.

Figure 4:
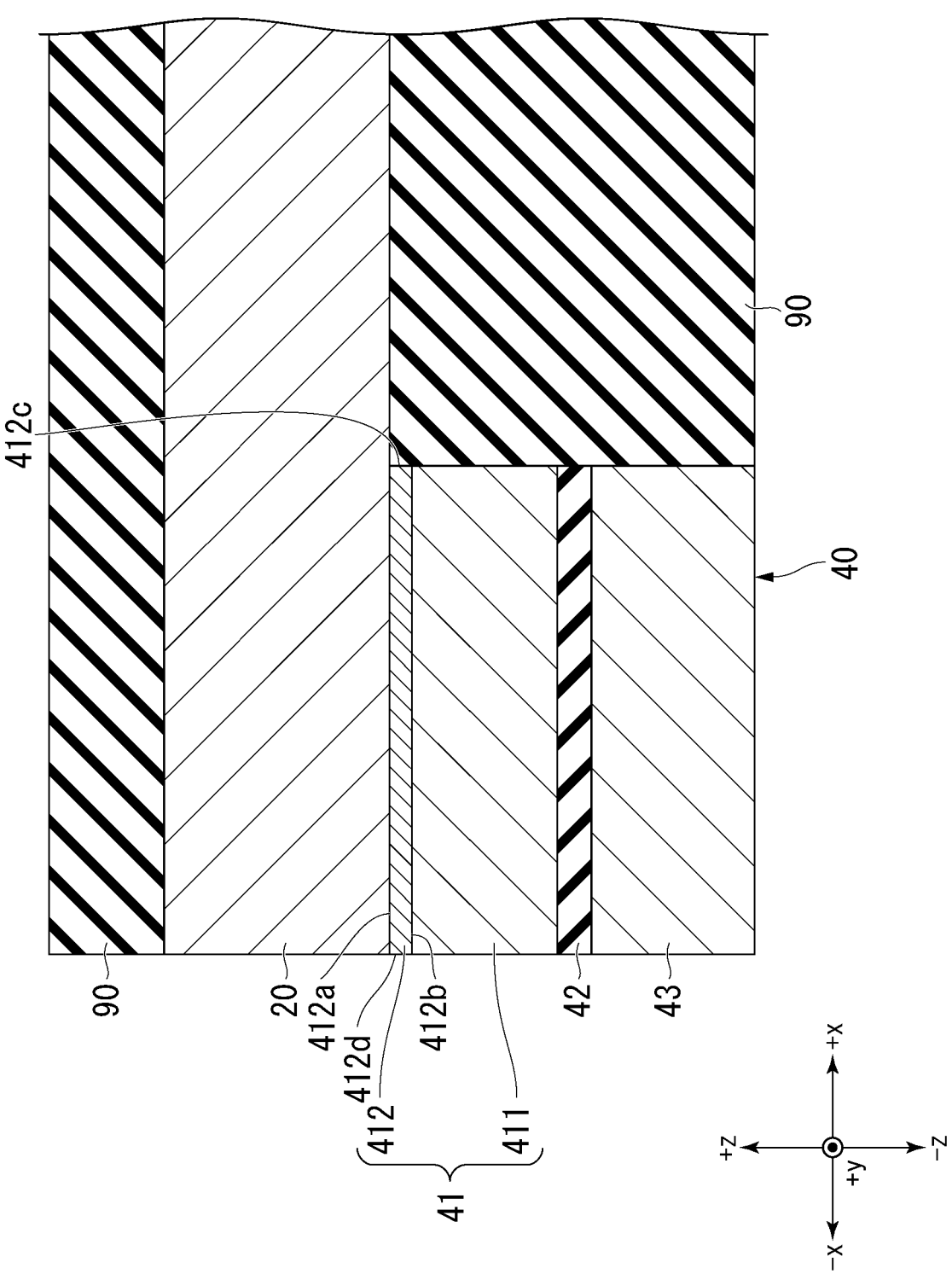
FIG. 4 is a cross-sectional view of a featured portion of the magnetic domain wall moving element according to the first embodiment.

FIG. 4 is a cross-sectional view of a main portion of the magnetic domain wall moving element 100 according to the first embodiment. FIG. 4 is an enlarged view of the vicinity of the first layer 41 of the first conductive layer 40 in FIG. 3. The first layer 41 has a main portion 411 and a mixing layer 412. The main portion 411 is located at a position separated from the magnetic recording layer 20 further than the mixing layer 412. The mixing layer 412 is located at an interface of the first layer 41 on a magnetic recording layer 20 side. The main portion 411 is a main portion of the first layer 41. The mixing layer 412 is a layer in which a ferromagnetic material included in the first layer 41 and a dissimilar metal are mixed. For example, in a case in which the first layer 41 is a laminated film in which Co and Pt are alternately laminated, the ferromagnetic material included in the first layer 41 is Co, which is a main ferromagnetic material constituting the first layer 41.

The dissimilar metal may be dispersed in the mixing layer 412 or locally distributed. The dissimilar metal is a metal different from each of the ferromagnetic material that mainly constitutes the first layer 41 and the ferromagnetic material that mainly constitutes the magnetic recording layer 20. The dissimilar metal is, for example, a non-magnetic metal. When the dissimilar metal is a non-magnetic metal, it is possible to prevent pinning of the magnetization of the magnetic recording layer 20 from being disturbed at a position at which it overlaps the first conductive layer 40 in the z direction. The dissimilar metal includes, for example, at least one selected from the group consisting of Ru, Ir, Ta, and Rh.

A concentration of the dissimilar metal in the mixing layer 412 is, for example, higher on a first surface 412a than on a second surface 412b. The first surface 412a is a surface of the mixing layer 412 on the magnetic recording layer 20 side, and the second surface 412b is a surface opposite to the first surface 412a. The concentration of the dissimilar metal in the mixing layer 412 decreases as it approaches the second surface 412b from the first surface 412a, for example. When the concentration of the dissimilar metal on the first surface 412a is higher than that on the second surface 412b, intrusion of the domain wall 27 into the position at which it overlaps the first conductive layer 40 in the z direction of the magnetic recording layer 20 can be further inhibited, and deterioration of magnetic characteristics of the first layer 41 can be inhibited.

The concentration of the dissimilar metal in the mixing layer 412 is, for example, higher at a first end 412c than at a second end 412d. The first end 412c is an end portion of the mixing layer 412 on a side closer to a center of the magnetic recording layer 20 in the x direction. The second end 412*d* is an end portion of the mixing layer 412 opposite to the first end 412*c*. The second end 412*d* is an end portion of the mixing layer 412 on a side far from the center of the magnetic recording layer 20 in the x direction. The concentration of the dissimilar metal in the mixing layer 412 decreases as it approaches the second end 412*d* from the first end 412*c*, for example. When the concentration of the dissimilar metal at the first end 412*c* is high, it becomes difficult for the domain wall 27 to intrude into the magnetization pinned region. Further, by lowering the concentration of the dissimilar metal at the second end 412*d*, it is possible to inhibit deterioration of magnetic characteristics of the magnetic domain wall moving element 100.

The mixing layer 412 is formed by sputtering the dissimilar metal on a surface of the first conductive layer 40 on the magnetic recording layer 20 side. The dissimilar metal is laminated to such a thickness that the dissimilar metal does not form a continuous layer. A thickness that does not form a continuous layer is approximately three times or less an atomic diameter of the dissimilar metal. The mixing layer 412 is formed by driving the dissimilar metal into the first layer 41.

Figure 5:
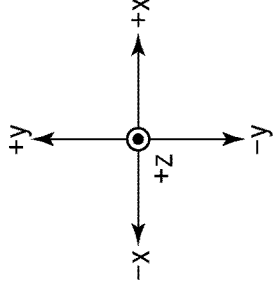
FIG. 5 is a plan view of a mixing layer according to the first embodiment.
Figure 6:
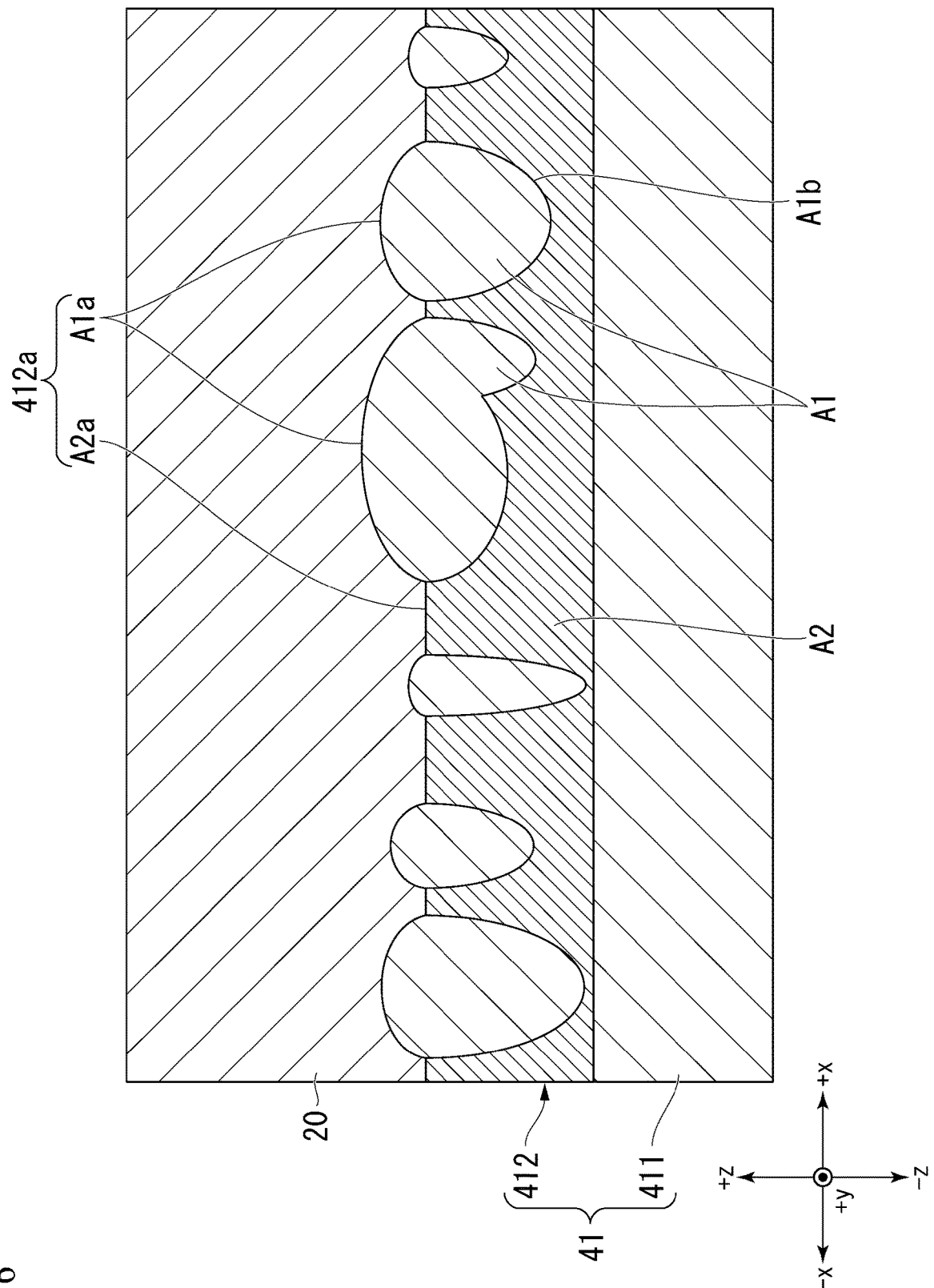
FIG. 6 is a cross-sectional view of the mixing layer according to the first embodiment.

FIG. 5 is a plan view of an example of the mixing layer 412 according to the first embodiment. FIG. 6 is a cross-sectional view of the example of the mixing layer 412 according to the first embodiment. FIGS. 5 and 6 are examples in which the dissimilar metal is locally distributed in the mixing layer 412. The mixing layer 412 is divided into, for example, a first portion A1 and a second portion A2. The first portion A1 is a portion in which the dissimilar metal is locally distributed. The second portion A2 is a portion other than the dissimilar metal and is made of the same material as the main portion 411.

The first portion A1 is formed by, for example, driving the dissimilar metal into the first layer 41. A thickness of the first portion A1 in the z direction differs depending on a location in the xy plane of the mixing layer 412, for example. The thickness of the first portion A1 varies from place to place, for example, depending on an amount of energy of the dissimilar metal when being driven into the first layer 41. A thickness of the mixing layer 412 varies from place to place due to the first portion A1.

Surfaces of the first portion A1 are curved due to a difference in surface tension with an adjacent material, for example. Among the surfaces of the first portion A1, a surface protruding in the +z direction from an interface between the second portion A2 and the magnetic recording layer 20 is referred to as a first surface A1*a*, and a surface protruding in the −z direction therefrom is referred to as a second surface A1*b*. The first surface A1*a* protrudes from a surface A2*a* of the second portion A2 in the +z direction, and thus the first surface 412*a* of the mixing layer 412 becomes uneven in the z direction. For example, the dissimilar metal is driven into the first layer 41, whereby the second surface A1*b* protrudes from the surface A2*a* of the second portion A2 in the −z direction.

"Second Conductive Layer"

The second conductive layer 50 has a fourth layer 51, a fifth layer 52, and a sixth layer 53. The fourth layer 51 and the sixth layer 53 are ferromagnetic layers. The fifth layer 52 is a non-magnetic layer. The fourth layer 51 and the sixth layer 53 are antiferromagnetically coupled with the fifth layer 52 interposed therebetween. The second conductive layer 50 has an SAF structure. Magnetization $M_{51}$ of the fourth layer 51 is oriented in the −z direction, for example, and magnetization $M_{53}$ of the sixth layer 53 is oriented in the +z direction, for example. The fifth layer 52 may be referred to as an intermediate layer, an insertion layer, a magnetic coupling layer, or the like.

The same materials as those of the first layer 41 and the third layer 43 can be used for the fourth layer 51 and the sixth layer 53. The same material as that of the second layer 42 can be used for the fifth layer 52.

The fourth layer 51 preferably has a mixing layer at an interface with the magnetic recording layer 20. The mixing layer located at the interface between the fourth layer 51 and the magnetic recording layer 20 is an example of the third mixing layer. The mixing layer located at the interface between the fourth layer 51 and the magnetic recording layer 20 is a layer in which a ferromagnetic material and a dissimilar metal included in the fourth layer 51 are mixed. The dissimilar metal is a metal different from the ferromagnetic material that mainly constitutes each of the fourth layer 51 and the magnetic recording layer 20. The dissimilar metal is, for example, a non-magnetic metal. The dissimilar metal includes, for example, at least one selected from the group consisting of Ru, Ir, Ta, and Rh. The dissimilar metal may be dispersed in the mixing layer or locally distributed.

The magnetization directions of the first ferromagnetic layer 10, the magnetic recording layer 20, the first conductive layer 40, and the second conductive layer 50 of the magnetic domain wall moving element 100 can be confirmed, for example, by measuring a magnetization curve. The magnetization curve can be measured using, for example, a magneto optical Kerr effect (MOKE). The measurement using the MOKE is a measurement method performed by using a magneto optical effect (magnetic Kerr effect) in which linearly polarized light is incident on a measurement target object and rotation in a polarization direction thereof occurs.

Next, a method for manufacturing the magnetic recording array 200 will be described. The magnetic recording array 200 is formed by a laminating step of each layer and a processing step of processing a portion of each layer into a predetermined shape. For the lamination of each layer, a sputtering method, a chemical vapor deposition (CVD) method, an electron beam vapor deposition method (EB vapor deposition method), an atomic laser deposition method, or the like can be used. The processing of each layer can be performed by using photolithography or the like.

First, impurities are doped at predetermined positions on the substrate Sub to form the source regions S and the drain regions D. Next, the gate insulating films GI and the gate electrodes G are formed between the source regions S and the drain regions D. The source regions S, the drain regions D, the gate insulating films GI, and the gate electrodes G serve as the transistors Tr.

Next, the insulating layer 90 is formed to cover the transistors Tr. Further, the connection wirings Cw are formed by forming the opening portions in the insulating layer 90 and filling the opening portion with a conductor. The first wirings Wp and the second wirings Cm are formed by laminating the insulating layer 90 to a predetermined thickness, forming grooves in the insulating layer 90, and filling the grooves with the conductor.

The first conductive layer 40 and the second conductive layer 50 can be formed by, for example, laminating a ferromagnetic layer, a non-magnetic layer, and a ferromagnetic layer in order on one surface of the insulating layer 90 and the connection wirings Cw and removing portions other than portions that will be the first conductive layer 40 and the second conductive layer 50. The removed portions are filled with, for example, the insulating layer 90. The mixing layer can be formed, for example, by sputtering a dissimilar metal onto the first layer 41 and the fourth layer 51.

Finally, the ferromagnetic layer, the non-magnetic layer, and the ferromagnetic layer are laminated in order over the first conductive layer 40 and the second conductive layer 50, and processed into a predetermined shape, and thus the magnetic recording layer 20, the non-magnetic layer 30, and the first ferromagnetic layer 10 are formed.

The magnetic domain wall moving element 100 according to the first embodiment can prevent the domain wall 27 from intruding at the positions (magnetization pinned regions) in which it overlaps the first conductive layer 40 and the second conductive layer 50 of the magnetic recording layer 20 in the z direction. When the domain wall 27 reaches end portions of the magnetic recording layer 20, the domain wall 27 disappears, and data may not be recorded. By inhibiting the intrusion of the domain wall 27 into the positions in which it overlaps the first conductive layer 40 and the second conductive layer 50 in the z direction, data can be easily written and read.

The mixing layer 412 serves as a pinning site for the domain wall 27. The pinning site is a portion at which the magnetization becomes difficult to move. The pinning site affects an adjacent region (the magnetic recording layer 20) and achieves an effect of pinning the magnetization more strongly. In the mixing layer 412, due to dissipative presence of the dissimilar metal in the xy plane, energy potential in the xy plane is not uniform. When the dissimilar metal is locally distributed, a difference in energy potential within the xy plane increases. The domain wall 27 becomes difficult to move in a portion in which the energy potential is low, and the movement of the domain wall 27 is restricted. That is, the mixing layer 412 can prevent the domain wall 27 from intruding at the positions in which it overlaps the first conductive layer 40 and the second conductive layer 50 in the z direction.

In addition, generally, the magnitude of the magnetization is different for each region in different state due to crystal grains, a surface condition, a step, etching damage, etc. Accordingly, when the first surface 412a of the mixing layer 412 has unevenness, the magnetization of the magnetic recording layer 20 at the position at which it is in contact with the mixing layer 412 is more pinned, and it is possible to further prevent the domain wall 27 from intruding at the positions in which it overlaps the first conductive layer 40 and the second conductive layer 50 in the z direction. Further, when a dissimilar element is sputtered into the first layer 41 and the fourth layer 51, the first layer 41 and the fourth layer 51 are damaged. Since a surface condition or the like of a damaged portion changes, the magnetization at a position at which the magnetic recording layer 20 is in contact with the mixing layer 412 is more strongly pinned.

Further, the mixing layer 412 is particularly useful when the first conductive layer 40 and the second conductive layer 50 have an SAF structure. In a case in which the first conductive layer 40 has an SAF structure, stability of the magnetizations $M_{41}$ and $M_{51}$ of the first layer 41 and the fourth layer 51 with respect to an external magnetic field increases, but stability with respect to an electric current degreases. In the case in which the first conductive layer 40 has an SAF structure, a magnetic field generated by the first layer 41 and a magnetic field generated by the third layer 43 are in a weakening relationship with each other, and saturated magnetization of the entire first conductive layer 40 decreases. When the saturation magnetization of the entire first conductive layer 40 decreases, a threshold current density of the magnetic recording layer 20 at the position at which it is in contact with the first conductive layer 40 decreases. The threshold current density is a current density that serves as a threshold at which the domain wall 27 starts to move in the magnetic recording layer 20. In the case in which the first conductive layer 40 has an SAF structure, the threshold current density is reduced by an order of magnitude as compared with a case in which the first conductive layer 40 has only the first layer 41.

The decrease in the threshold current density of the magnetic recording layer 20 at the position at which it is in contact with the first conductive layer 40 means that, when a current having the same current density is applied, the domain wall 27 easily intrudes into the position in which it overlaps the first conductive layer 40 in the z direction. That is, in the case in which the first conductive layer 40 has an SAF structure, the problem that the domain wall 27 intrudes into the position in which it overlaps the first conductive layer 40 in the z direction becomes a remarkable problem. Even in the case in which the first conductive layer 40 has an SAF structure, the mixing layer 412 can prevent the domain wall 27 from intruding into the position in which it overlaps the first conductive layer 40 in the z direction.

Although examples of the magnetic recording array 200 and the magnetic domain wall moving element 100 according to the first embodiment have been described in detail, the magnetic recording array 200 and the magnetic domain wall moving element 100 according to the first embodiment can be variously modified and changed within the scope of the gist of the present invention.

Figure 7:
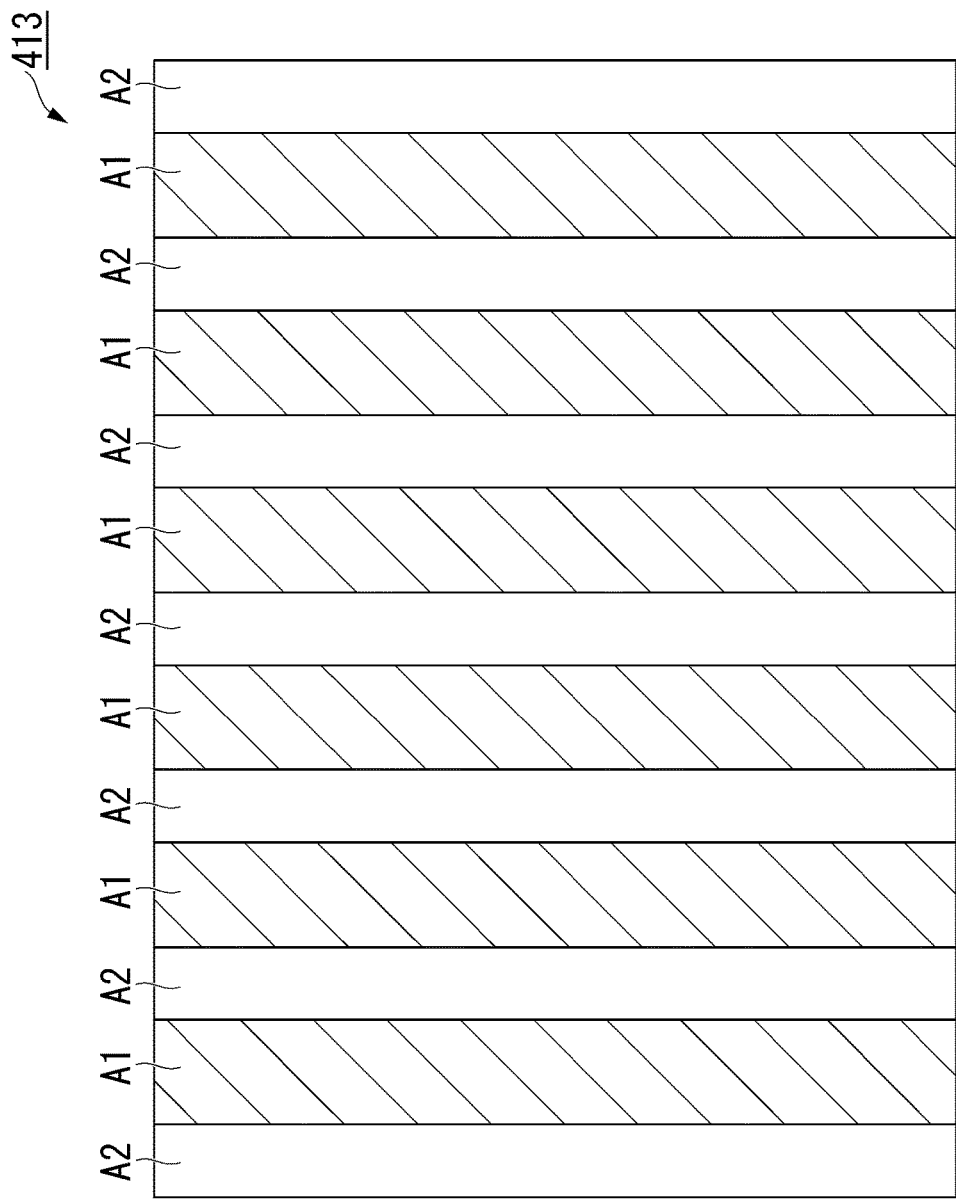
FIG. 7 is a plan view of another example of the mixing layer according to the first embodiment.
Figure 7:
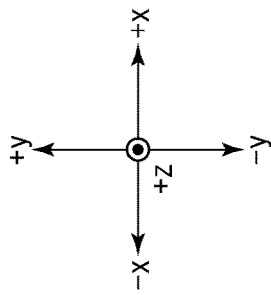

For example, FIG. 7 is a plan view of another example of the mixing layer according to the first embodiment. In the mixing layer 413 shown in FIG. 7, the first portions A1 and the second portions A2 are alternately arranged in the x direction. The first portions A1 and the second portions A2 extend in the y direction.

The domain wall 27 moves in the x direction. When the mixing layer 413 has a potential distribution in the x direction, it is possible to efficiently inhibit the intrusion of the domain wall 27 into the positions in which it overlaps the first conductive layer 40 and the second conductive layer 50 in the z direction. The mixing layer 413 shown in FIG. 7 can be formed, for example, by sputtering the dissimilar metal through a mask having opening portions and mask portions alternately in the x direction. Further, the mixing layer 413 can be formed by photolithography or the like.

Second Embodiment

Figure 8:
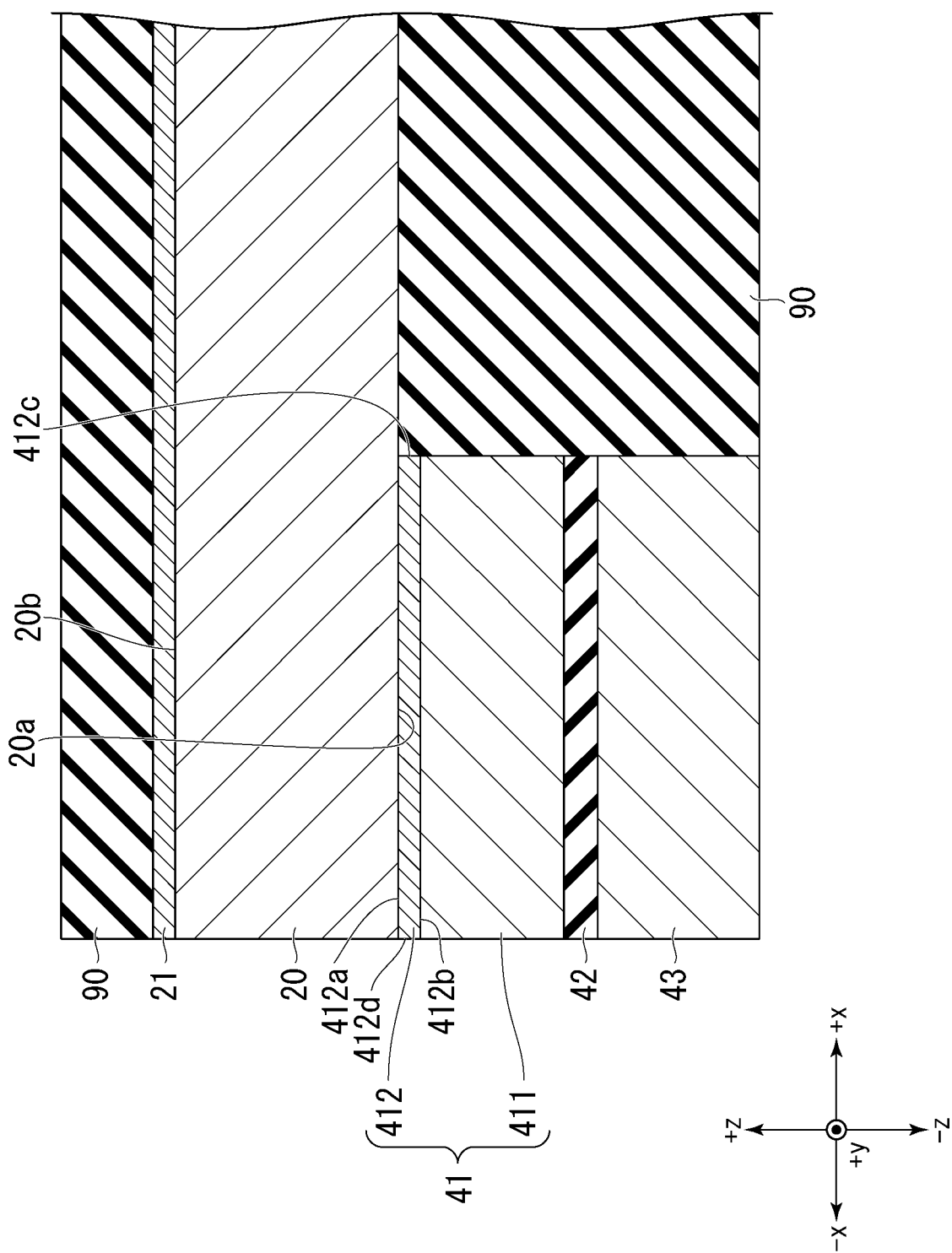
FIG. 8 is a cross-sectional view of a featured portion of a magnetic domain wall moving element according to a second embodiment.

FIG. 8 is a cross-sectional view of a featured portion of a magnetic domain wall moving element according to a second embodiment. The magnetic domain wall moving element shown in FIG. 8 is different from the magnetic domain wall moving element shown in FIG. 4 in that a mixing layer 21 is formed on a second surface 20b of the magnetic recording layer 20. In FIG. 8, the same configurations as those in FIG. 4 are denoted by the same reference numerals, and the description thereof will be omitted.

The mixing layer 21 is on the second surface 20b of the magnetic recording layer 20. The second surface 20b is a surface on a side opposite to the first surface 20a in contact with the first conductive layer 40 of the magnetic recording layer 20. The mixing layer 21 is an example of a second mixing layer. The mixing layer 21 is a layer in which a ferromagnetic material that mainly constitute the magnetic recording layer 20 and a dissimilar metal are mixed. The dissimilar metal may be dispersed in the mixing layer 21 or locally distributed. The dissimilar metal is a metal different from the ferromagnetic material that mainly constitutes the magnetic recording layers 20. The dissimilar metal is, for example, a non-magnetic metal. The dissimilar metal includes, for example, at least one selected from the group consisting of Ru, Ir, Ta, and Rh.

Since the first conductive layer 40 has the mixing layer 412 in the magnetic domain wall moving element according to the second embodiment, it is possible to prevent the domain wall 27 from intruding at the positions in which it overlaps the first conductive layer 40 and the second conductive layer 50 in the z direction. Further, by having the mixing layer 21 on the surface opposite to the mixing layer 412, the movement of the domain wall 27 can be further inhibited.

Third Embodiment

Figure 9:
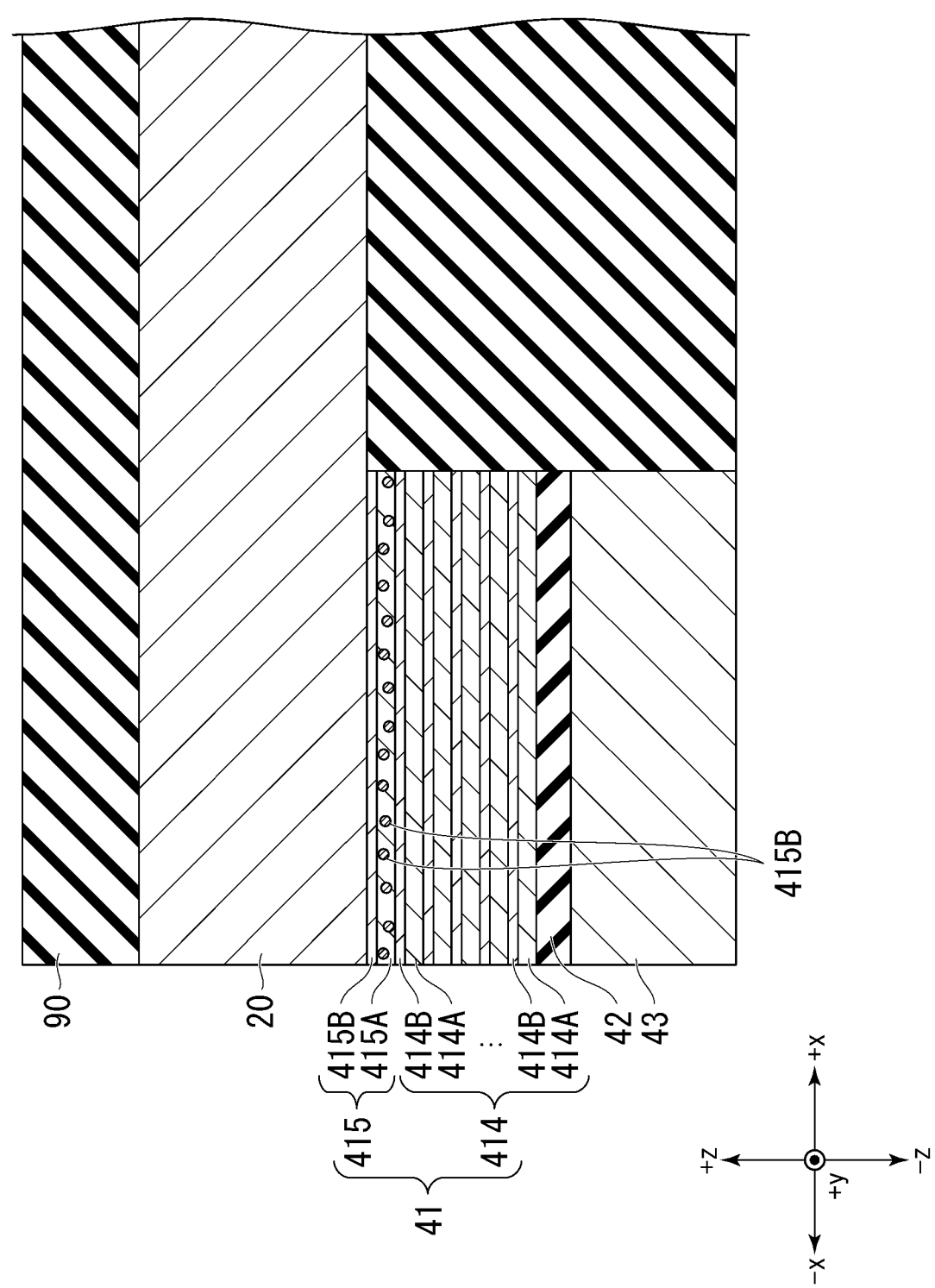
FIG. 9 is a cross-sectional view of a featured portion of a magnetic domain wall moving element according to a third embodiment.

FIG. 9 is a cross-sectional view of a main portion of a magnetic domain wall moving element according to a third embodiment. The magnetic domain wall moving element shown in FIG. 9 is different from the magnetic domain wall moving element shown in FIG. 4 in configurations of a main portion 414 and a mixing layer 415 of the first layer 41. In FIG. 8, the same configurations as those in FIG. 4 are denoted by the same reference numerals, and the description thereof will be omitted.

The main portion 414 is located to be separated from the magnetic recording layer 20 further than the mixing layer 415. The mixing layer 415 is located at the interface of the first layer 41 on the magnetic recording layer 20 side. A ferromagnetic material 414A and a non-magnetic material 414B are alternately laminated in the main portion 414. In the mixing layer 415, a ferromagnetic material 415A and a non-magnetic material 415B are alternately laminated, and a non-magnetic material 415B is dispersed in the ferromagnetic material 415A. The ferromagnetic materials 414A and 415A are, for example, Co, and the non-magnetic materials 414B and 415B are, for example, Pd, Pt, or Ni.

In the mixing layer 415, the non-magnetic material 415B is scattered in the ferromagnetic material 415A, and thus the energy potential in the xy plane is not uniform. For that reason, the mixing layer 415 serves as a pinning site for the domain wall 27. The mixing layer 415 inhibits intrusion of the domain wall 27 into the positions in which it overlaps the first conductive layer 40 and the second conductive layer 50 in the z direction.

Fourth Embodiment

Figure 10:
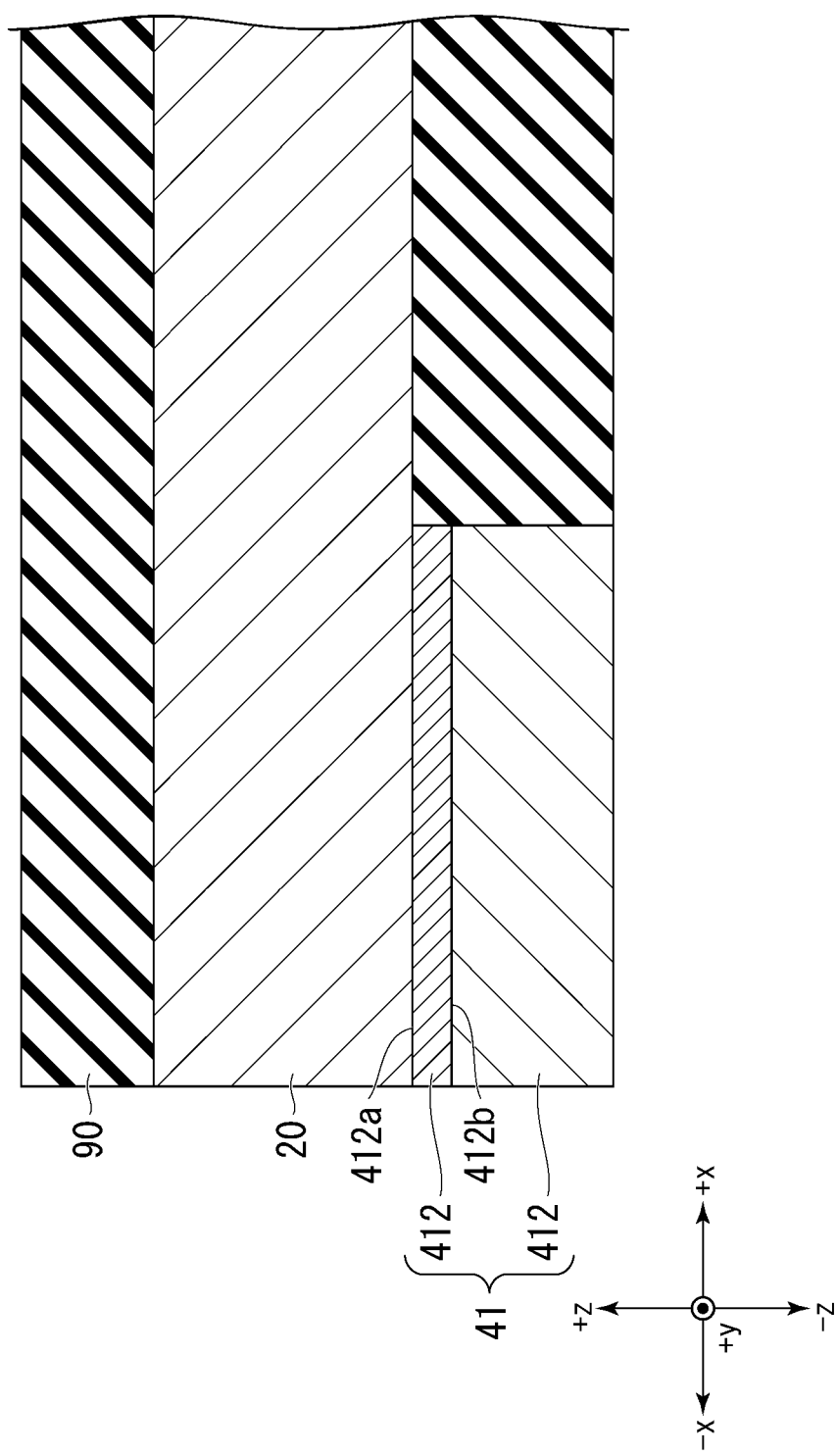
FIG. 10 is a cross-sectional view of a featured portion of a magnetic domain wall moving element according to a fourth embodiment.

FIG. 10 is a cross-sectional view of a main portion of a magnetic domain wall moving element according to a fourth embodiment. The magnetic domain wall moving element shown in FIG. 10 is different from the magnetic domain wall moving element shown in FIG. 4 in that the first conductive layer 40 is configured of only the first layer 41. In FIG. 10, the same configurations as those in FIG. 4 are denoted by the same reference numerals, and the description thereof will be omitted.

As described above, the magnetic domain wall moving element is particularly useful when the first conductive layer 40 has an SAF structure, but when a large external force is applied even in a case in which the first conductive layer 40 does not have an SAF structure, the domain wall 27 may intrude at the position in which it overlaps the first conductive layer 40. The first layer 41 has the mixing layer 412, and thus it is possible to prevent the domain wall 27 from intruding at the positions in which it overlaps the first conductive layer 40 and the second conductive layer 50 in the z direction.

Preferred embodiments of the present invention have been described above in detail, but the present invention is not limited to a specific embodiment, and various modifications and changes can be made within the scope of the gist of the present invention described in the claims.

For example, the characteristic configurations in the first to fourth embodiments may be combined. Further, the description of the above embodiments has been on the basis of the example in which both the first conductive layer 40 and the second conductive layer 50 have a mixing layer, but only the first conductive layer 40 may have a mixing layer.

REFERENCE SIGNS LIST

10 First ferromagnetic layer
20 Magnetic recording layer
20a, 412a, First surface
20b, 412b, Second surface
412c First end
412d Second end
21, 412, 413, 415 Mixing layer
27 Domain wall
28 First magnetic domain
29 Second magnetic domain
30 Non-magnetic layer
40 First conductive layer
41 First layer
42 Second layer
43 Third layer
50 Second conductive layer
51 Fourth layer
52 Fifth layer
53 Sixth layer
90 Insulating layer
100 Magnetic domain wall moving element
110 First switching element
120 Second switching element
130 Third switching element
200 Magnetic recording array
411,414 Main portion
414A, 415A Ferromagnetic material
414B, 415B Non-magnetic material
A1 First portion
A2 Second portion
A1a First surface
A1b Second surface

What is claimed is:
1. A magnetic domain wall moving element comprising:
a magnetic recording layer which extends in a first direction and includes a ferromagnetic material; and
a first conductive layer and a second conductive layer which are separately connected to the magnetic recording layer,
wherein the first conductive layer includes a first layer that exhibits ferromagnetism and in contact with the magnetic recording layer,
the first layer includes a mixing layer at an interface with the magnetic recording layer,
a ferromagnetic material and a dissimilar metal are mixed in the mixing layer,
when viewed from a laminating direction, the mixing layer includes a plurality of first portions containing the dissimilar metal which is locally distributed and a second portion containing other than dissimilar metal, the dissimilar metal is a metal different from each of the ferromagnetic material that mainly constitutes the first layer and the ferromagnetic material that mainly constitutes the magnetic recording layer, and a magnetization of the first layer is in a same fixed direction as the magnetization of a portion of the magnetic recording layer that overlaps with the first layer in a laminating direction.

2. The magnetic domain wall moving element according to claim 1, wherein the first conductive layer has a second layer that exhibits non-magnetism and a third layer that exhibits ferromagnetism in order on a surface of the first layer opposite to the magnetic recording layer.

3. The magnetic domain wall moving element according to claim 1, wherein the dissimilar metal is a non-magnetic metal.

4. The magnetic domain wall moving element according to claim 1, wherein a concentration of the dissimilar metal is higher on a first surface of the mixing layer on a side closer to the magnetic recording layer than on a second surface opposite to the first surface.

5. The magnetic domain wall moving element according to claim 1, wherein the dissimilar metal has a concentration distribution in the first direction, and a first end of the mixing layer on a side closer to a center of the magnetic recording layer in the first direction has a higher concentration of the dissimilar metal than the second end opposite to the first end.

6. The magnetic domain wall moving element according to claim 1, wherein the dissimilar metal is locally distributed in the mixing layer.

7. The magnetic domain wall moving element according to claim 6, wherein a thickness of the mixing layer varies from place to place due to the first portion.

8. The magnetic domain wall moving element according to claim 6, wherein a surface of the mixing layer is uneven in a laminating direction due to the first portion in which the dissimilar metal is locally distributed.

9. The magnetic domain wall moving element according to claim 1, wherein the magnetic recording layer includes a second mixing layer on a side opposite to a surface connected to the first conductive layer, the ferromagnetic material included in the magnetic recording layer and the dissimilar metal are mixed in the second mixing layer, and the dissimilar metal is a metal different from the ferromagnetic material that mainly constitutes the magnetic recording layer.

10. The magnetic domain wall moving element according to claim 1, wherein the second conductive layer includes a fourth layer that exhibits ferromagnetism and in contact with the magnetic recording layer, the fourth layer includes a third mixing layer at an interface with the magnetic recording layer, a ferromagnetic material and a dissimilar metal are mixed in the third mixing layer, and the dissimilar metal is a metal different from each of the ferromagnetic material that mainly constitutes the fourth layer and the ferromagnetic material that mainly constitutes the magnetic recording layer.

11. A magnetic domain wall moving element comprising:

a magnetic recording layer which extends in a first direction and includes a ferromagnetic material; and a first conductive layer and a second conductive layer which are separately connected to the magnetic recording layer, wherein the first conductive layer includes a first layer that exhibits ferromagnetism and in contact with the magnetic recording layer, the first layer includes a mixing layer at an interface with the magnetic recording layer, a non-magnetic material and a ferromagnetic material are alternately laminated in the first layer, the ferromagnetic material and the non-magnetic material are mixed in the mixing layer, when viewed from a laminating direction, the mixing layer includes a plurality of first portions containing the non-magnetic material which is locally distributed and a second portion containing other than non-magnetic material, and a magnetization of the first layer is in a same fixed direction as the magnetization of a portion of the magnetic recording layer that overlaps with the first layer in a laminating direction.

12. The magnetic domain wall moving element according to claim 1, further comprising:

a first ferromagnetic layer facing the magnetic recording layer; and a non-magnetic layer located between the first ferromagnetic layer and the magnetic recording layer.

13. A magnetic recording array comprising a plurality of magnetic domain wall moving elements according to claim 1.

* * * * *